(12) United States Patent
Morimoto

(10) Patent No.: US 8,860,047 B2
(45) Date of Patent: Oct. 14, 2014

(54) SEMICONDUCTOR LIGHT-EMITTING DEVICE

(71) Applicant: Stanley Electric Co., Ltd., Tokyo (JP)

(72) Inventor: Mayo Morimoto, Tokyo (JP)

(73) Assignee: Stanley Electric Co., Ltd., Tokyo (JP)

(*) Notice: Subject to any disclaimer, the term of this patent is extended or adjusted under 35 U.S.C. 154(b) by 0 days.

(21) Appl. No.: 13/941,364

(22) Filed: Jul. 12, 2013

(65) Prior Publication Data

US 2014/0014980 A1    Jan. 16, 2014

(30) Foreign Application Priority Data

Jul. 12, 2012 (JP) ................................ 2012-156680

(51) Int. Cl.
| | |
|---|---|
| *H01L 21/02* | (2006.01) |
| *H01L 33/50* | (2010.01) |
| *H01L 33/52* | (2010.01) |
| *H01L 33/54* | (2010.01) |
| *H01L 33/56* | (2010.01) |

(52) U.S. Cl.
CPC .............. *H01L 33/52* (2013.01); *H01L 33/501* (2013.01); *H01L 33/507* (2013.01); *H01L 33/54* (2013.01); *H01L 33/56* (2013.01)
USPC ................... 257/88; 257/89; 257/98; 257/99; 257/E33.058; 257/E33.072

(58) Field of Classification Search
CPC ......... H01L 23/12; H01L 23/16; H01L 23/28; H01L 23/31; H01L 23/38; H01L 23/40; H01L 23/48; H01L 23/52; H01L 23/562; H01L 24/01; H01L 24/73; H01L 25/16; H01L 25/18; H01L 33/52–33/56; H01L 33/501; H01L 33/507

USPC .............. 257/88–89, 98–100, E33.58, 59, 72
See application file for complete search history.

(56) References Cited

U.S. PATENT DOCUMENTS

| | | | | |
|---|---|---|---|---|
| 6,653,157 | B2 * | 11/2003 | Kondo | ............................ 438/22 |
| 7,429,757 | B2 * | 9/2008 | Oyama et al. | ................... 257/98 |
| 7,489,031 | B2 * | 2/2009 | Roberts et al. | ............... 257/687 |
| 8,115,106 | B2 | 2/2012 | Tanaka et al. | |
| 8,247,825 | B2 * | 8/2012 | Ku et al. | ........................ 257/88 |
| 8,294,162 | B2 * | 10/2012 | Nakajima | ....................... 257/88 |

(Continued)

FOREIGN PATENT DOCUMENTS

JP     2001-127345 A    5/2001

*Primary Examiner* — Michael Lebentritt
(74) *Attorney, Agent, or Firm* — Kenealy Vaidya LLP

(57) ABSTRACT

A reliable semiconductor light-emitting device can include a wavelength converting material in a cavity mounting at least one semiconductor light-emitting chip. The device can also include an encapsulating resin to cover the wavelength converting material so as to emit a wavelength-converted light using light emitted from the chip. The wavelength converting material should include a transparent resin having a large thermal expansion coefficient to maintain a high thermal resistance, and the encapsulating resin is subject to cracks due to a high transparent resin. The semiconductor device can be configured to form a space between the wavelength converting material and the encapsulating resin so that each of the encapsulating resin and the wavelength converting material cannot contact with each other even under a high temperature. Thus, the disclosed subject matter cannot stress in the encapsulating resin when the wavelength converting material expands, and therefore can provide the reliable semiconductor light-emitting device.

20 Claims, 18 Drawing Sheets

(56) References Cited

U.S. PATENT DOCUMENTS 8,581,287 B2* 11/2013 Waragaya et al. .............. 257/98
2009/0290205 A1* 11/2009 Satoh et al. ................ 359/199.2
2010/0155766 A1* 6/2010 Ku .................................. 257/99
2010/0157583 A1* 6/2010 Nakajima ..................... 362/184
2014/0027807 A1* 1/2014 Tasaki et al. .................... 257/98

* cited by examiner

FIG. 5a  Comparative Embodiment
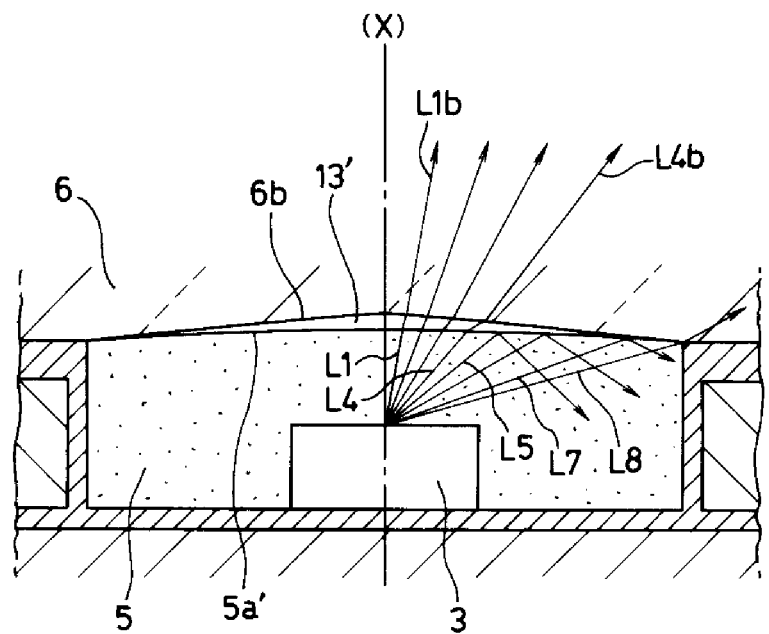
FIG. 5b  Comparative Embodiment
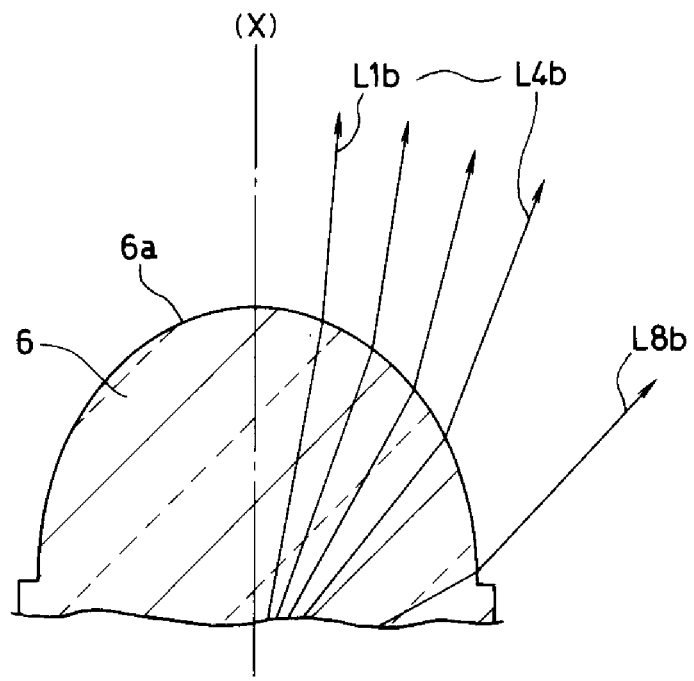

FIG. 6a  Comparison with Comparative Embodiment
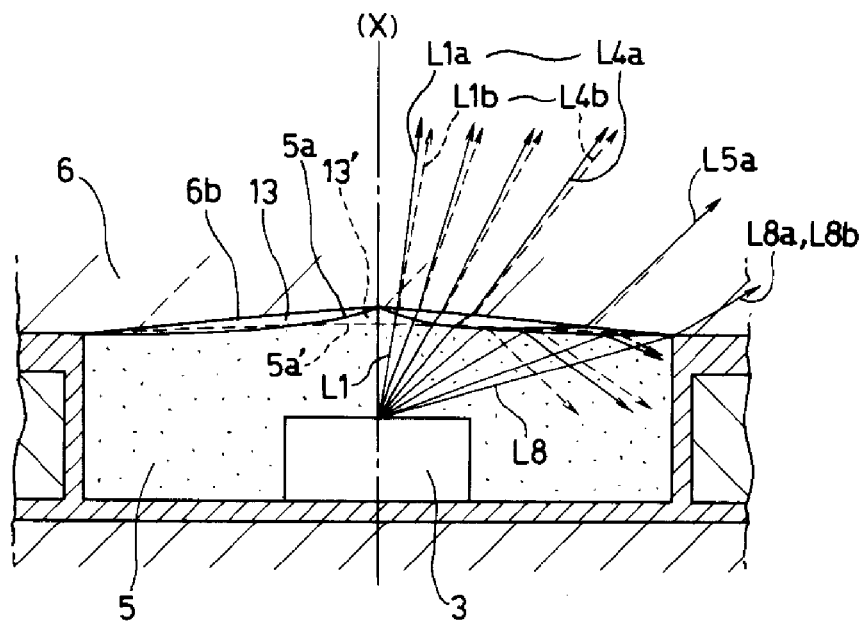
FIG. 6b  Comparison with Comparative Embodiment
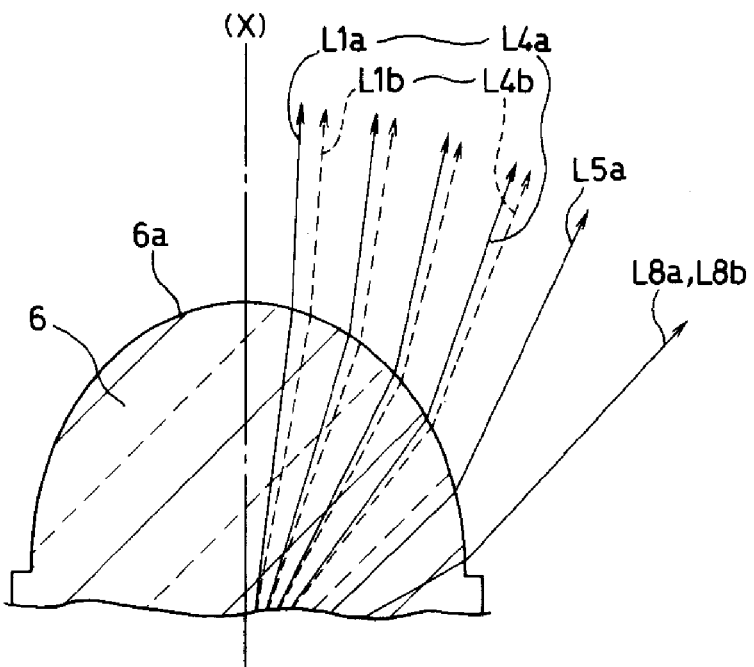

FIG. 8a
FIG. 8b
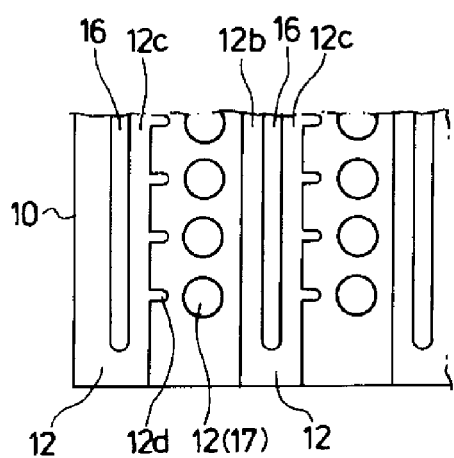
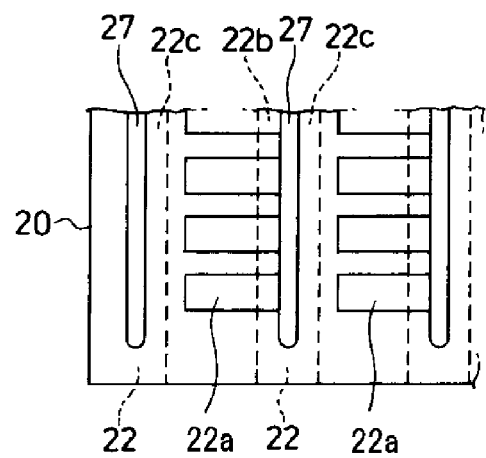

FIG. 16a  Comparison with Comparative Embodiment
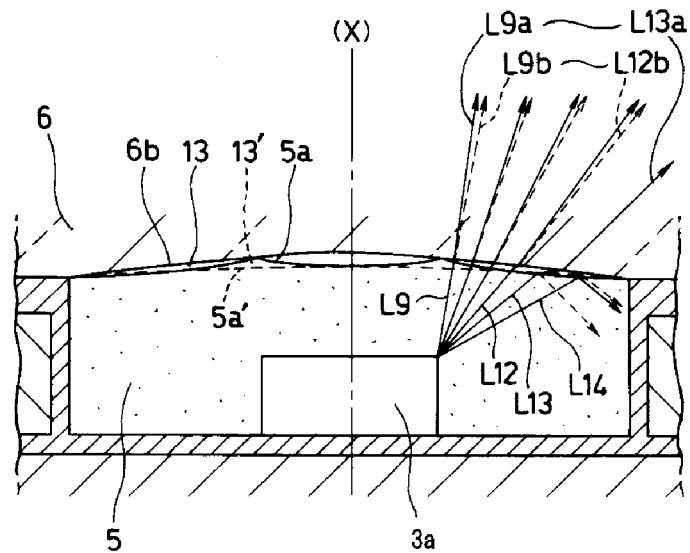
FIG. 16b  Comparison with Comparative Embodiment
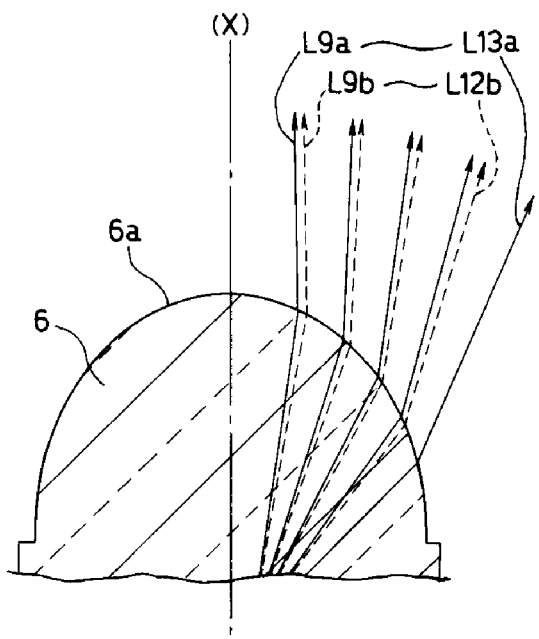

SEMICONDUCTOR LIGHT-EMITTING DEVICE

This application claims the priority benefit under 35 U.S.C. §119 of Japanese Patent Application No. 2012-156680 filed on Jul. 12, 2012, which is hereby incorporated in its entirety by reference.

BACKGROUND

1. Field

The presently disclosed subject matter relates to semiconductor light-emitting devices, and more particularly to surface mount semiconductor light-emitting devices with a high reliable structure, which can prevent causing cracks in encapsulating resins during/after a reflow soldering process when the semiconductor light-emitting devices are mounted on a mounting circuit board.

2. Description of the Related Art

Semiconductor light-emitting devices, in which a part of the light emitted from a semiconductor light-emitting chip is converted into light having a different wavelength by a phosphor and in which a mixture light including the light having the different wavelength mixed with the light emitted directly from the semiconductor light-emitting chip is emitted, have been known as semiconductor light source(s) for various lighting units. In this case, the semiconductor light-emitting devices are usually provided with a wavelength converting material including a phosphor around the semiconductor light-emitting chip such as an LED chip, etc.

Meanwhile, in various semiconductor light-emitting devices, surface mount devices are frequently used for an electronic device such as a mobile phone, a personal computer and the like because they are small, light and can be directly mounted along with other electronic parts on a mounting circuit board in a reflow soldering process. Conventional semiconductor light-emitting devices of a surface mount type, for example, are disclosed in Patent Document No. 1 (Japanese Patent Application Laid Open JP2001-127345) and No. 2 (U.S. Pat. No. 8,115,106).

FIGS. 18a and 18b are a top view and a side cross-sectional view taken along line A-A in FIG. 18a showing a conventional semiconductor light-emitting device of the surface mount type, which may be used as a light source for a back light unit of an liquid crystal display (LCD) apparatus and the like and which is disclosed in Patent Document No. 1, respectively.

The conventional semiconductor light-emitting device includes: a mounting board 82 having a cavity 83 made by attaching a first board 80 having a top surface and an opening on a second board 81, and formed in a tabular shape; a first conductor pattern 84 formed continuously in the cavity 83, which is composed of the opening of the first board 80 and a part of the top surface of the second board 81, which is exposed from the first board 80, and extending from the cavity 83 toward the top surface of a side surface the first board 80 and a side surface and a bottom surface of the second board 81; and a second conductor pattern 85 being formed from another top surface of the first board 80 toward another bottom surface of the second board 81 so as to separate from the first conductor pattern 84.

In addition, the semiconductor light-emitting device also includes: a semiconductor light-emitting chip 86 having a top electrode and a bottom electrode mounted on the first conductor pattern 84, which is located on a bottom surface of the cavity 83, the bottom electrode thereof being electrically connected to the first conductor pattern 84, and the top electrode thereof being electrode connected to the second conductor pattern 85 via a bonding wire 87: and a transparent resin having a light-emitting surface being disposed on a part of each of the first conductor pattern 84 and the second conductor patted 85 so as to encapsulate the bonding wire 87 therewith, and formed in a dome shape, and the light-emitting surface thereof exposed from a top surface of the transparent resin 88 as a light-emitting surface of the device.

When the conventional light-emitting device is used as a light source for the back light unit of the LCD apparatus, the semiconductor light-emitting device should emit light having a substantially white color tone in general to show eye-friendly displays on the LCD apparatus. In this case, the conventional light-emitting device may further include a wavelength converting material 89 including a phosphor, which is located in the cavity 83 so as to cover the semiconductor light-emitting chip 86 therewith, and thereby may emit a wavelength converted light having the substantially white color tone.

For example, when the semiconductor light-emitting chip 86 is a blue LED chip emitting blue light and the wavelength converting material 89 is composed of a transparent resin including a yellow phosphor, which can emit a yellow light upon being excited by the blue light emitted from the blue LED chip, the semiconductor light-emitting device can emit substantially white light from the light-emitting surface of the transparent resin 88, by an additive color mixture of the excited yellow light emitted from the yellow phosphor and a part of the blue light emitted from the blue LED chip. Accordingly, the conventional semiconductor light-emitting device may be used as a light source for the back light unit of the LCD apparatus.

In a structure of the conventional semiconductor light-emitting device, as the transparent resin 88 including the light-emitting surface of the device, a transparent material having a high permeability such as an epoxy resin should be used. A transparent resin having a high thermal resistance such as a silicone resin would be use as the transparent resin for the wavelength converting material 89 so as to prevent a degradation of the wavelength converting material 89, which is caused by a heat generated from the semiconductor light-emitting chip 86 during operation.

However, a thermal expansion coefficient of the epoxy resin used to cast the transparent resin 88 may be extremely different from that of the silicone resin, which is used for the wavelength converting material 89. Specifically, the thermal expansion coefficient of the silicon resin, which is generally used as the transparent resin for the wavelength converting material 89, may be considerably larger than that of the epoxy resin, which is used as the transparent resin for the transparent resin 88.

Hence, when the semiconductor light-emitting devise of a wavelength converted type using the above-described structure is directly mounted along with the other electronic parts on the mounting circuit board in a reflow soldering process, the wavelength converting material 89 including the silicone resin, which is disposed in the cavity 83, may expand due to a heat of the reflow soldering. Said thermal expand may be applied toward the transparent resin 88, which is made from the epoxy resin having a small thermal expansion coefficient, because the first conductor pattern 84 is made of a solid metallic material and is sustained by a solid board of the mounting board 82.

Then the transparent resin 88 may be boosted in an upward direction thereof from the cavity 83 including the wavelength converting material 89 by a stress of the thermal expansion, and the thermal expansion stress may enlarge toward the transparent resin 88 in a radial fashion. Accordingly, a peeling may occur on a boundary between the transparent resin 88 and an annular section 84a of the first conductor pattern 84, which is located around an outer top edge of the wavelength converting material 89, and between the transparent resin 88 and another section of the first conductor pattern 84, which directly contacts with the transparent resin 88.

The peeling may extend from the annular section 84a in an outward direction of the first conductor pattern 84 along a connecting pattern 84b, which connects the annular section 84a to an electron portion of the first conductor pattern 84 that extends underneath the mounting board 82 as shown in FIG. 18a and FIG. 18b. After that, at the peeling portion where occurs on the boundary between the transparent resin 88 and the annular section 84a and the other section of the first conductor pattern 84 in the semiconductor light-emitting device mounted on the mounting circuit board, a fluid, a saline matter, a dirt, a dust and the like may enter toward the wavelength converting material 89.

In worst case, the fluid and the like may finally get to the semiconductor light-emitting chip 86 while the semiconductor light-emitting device has been used under various severe environments for a long time. As a result, the peeling may cause a degradation of optical characteristics such as a reduction of a light-emitting intensity, color variability, a light-emitting failure and the like, and finally may cause a failure of the semiconductor light-emitting device. Therefore, the above-described structure of the device may cause a degradation of a reliability of the semiconductor light-emitting device.

Such a peeling may be easy to occur when a Pb-free solder having a higher melting point of approximately 260 degrees centigrade than a tin-lead solder having a melting point of approximately 200 degrees centigrade is used in the reflow soldering process. Accordingly, the conventional semiconductor light-emitting device may be difficult to be used as a light source such that requires a high reliability, for example, when the semiconductor light-emitting device is used under various severe environments for a long time as a light source for automobile parts such as a position lamp, a room lamp, etc.

The above-referenced Patent Documents are listed below, and are hereby incorporated with their English abstracts in their entireties.
1. Patent Document No. 1: Japanese Patent Application Laid Open JP2001-127345.
2. Patent Document No. 2: U.S. Pat. No. 8,115,106.

The disclosed subject matter has been devised to consider the above and other problems, features, and characteristics. Thus, embodiments of the disclosed subject matter can include small semiconductor light-emitting devices having a high reliable structure, which can prevent causing cracks in encapsulating resins even when the semiconductor light-emitting devices are mounted on a mounting circuit board under a high temperature in a reflow soldering process, and which can emit a wavelength converted light having a high light-emitting efficiency and a high light-harvesting efficiency. The disclosed subject matter can also include a semiconductor light-emitting device using a plurality of semiconductor light-emitting chips that can be used for wavelength-converting light having a high light-emitting efficiency and a high light-harvesting efficiency.

SUMMARY

The presently disclosed subject matter has been devised in view of the above and other problems, features, and characteristics. An aspect of the disclosed subject matter includes providing small semiconductor light-emitting devices having a high light-emitting efficiency and a high light-harvesting efficiency in addition to a high reliability such that can be used to illuminate goods laid out in a narrow show window, a vending machine and the like, and also can be used to illuminate letters and figures in a thin display for the vending machine, etc.

According to an aspect of the disclosed subject matter, a semiconductor light-emitting device can include: a base board including a first board having a through hole and a second board, and formed in a substantially rectangular tabular shape, the first board including a first conductor pattern located adjacent the through hole and at least one bonding conductor pattern formed on a top surface thereof, the second board including a mounting conductor pattern formed on a top surface thereof, the base board attaching the first board on the top surface of second board, and thereby the through hole configured with a cavity having the mounting conductor pattern as a bottom surface of the cavity on the second board exposed from the first board, and an optical axis of the light-emitting device intersecting with a center on the bottom surface of the cavity at a substantially right angle; and at least one semiconductor light-emitting chip each having a top electrode and a bottom electrode mounted on the mounting conductor pattern in the cavity, each bottom electrode of the at least one semiconductor light-emitting chip electrically connected to the mounting conductor pattern exposed from the first board, and each top electrode electrically connected to a respective one of the at least one bonding conductor pattern via a bonding wire.

In addition, the semiconductor light-emitting device can include: a wavelength converting material made by mixing at least a phosphor with a first transparent resin, encapsulating the semiconductor light-emitting chip and a part of the bonding wire in the cavity, and the wavelength converting material banking from an inner top edge of the first conductor pattern of the first board toward the bonding wire; and an encapsulating resin composed of a second transparent resin, encapsulating another part of the bonding wire that is not encapsulated with the wavelength converting material, and covering the wavelength converting material, wherein the encapsulating resin and the wavelength converting material contacts with each other substantially between the part and the other part of the bonding wire, and a space is configured to occur between the encapsulating resin and the top surface of the wavelength converting material at least by using said bank from an inner top edge of the first conductor pattern of the first board toward the bonding wire.

In the above-described exemplary semiconductor light-emitting device, a thermal expansion coefficient of the first transparent resin of the wavelength converting material can be larger than that of the second transparent resin of the encapsulating resin, and specifically, the first transparent resin can be composed of a silicone resin and the second transparent resin can be composed of an epoxy resin. Additionally, the cavity can be formed in a substantially circular shape in a top view from the optical axis of the device, and each top electrode of the at least one semiconductor chip can be located substantially on at least one of the optical axis of the device and an imaginary circle in which the optical axis is central to the imaginary circle.

According to the above-described exemplary semiconductor light-emitting device, even when each of the encapsulating resin and the wavelength converting material extends in an approaching direction with respect to each other under a high temperature, each of the encapsulating resin and the wavelength converting material cannot contact with respect to each other due to the space. Therefore, each stress of an expansion and a contraction cannot remain in each of the encapsulating resin and the wavelength converting material during/after the reflow soldering process. Additionally, the number of Rays emitted from the above-described device can be larger than that of Rays emitted from a conventional device while the Rays emitted from the device are refracted in an approaching direction of the optical axis of the device because the top surface of the wavelength converting material can be formed in a substantially concave shape toward the semiconductor light-emitting chip using a surface tension thereof. Thus, the disclosed subject matter can include providing small semiconductor light-emitting devices having a high light-emitting efficiency and a high light-harvesting efficiency in addition to a high reliability such that can be used to illuminate letters and figures in a thin narrow display for the vending machine, etc.

Another aspect of the disclosed subject matter can include at least one semiconductor light-emitting chip having a first top electrode and a second top electrode in place of the at least one semiconductor light-emitting chip having the top electrode and the bottom electrode by using the above-described similar structure. In the exemplary semiconductor light-emitting devices, the same or similar variations of the device can also be employed as set forth in preceding paragraphs.

According to the exemplary semiconductor light-emitting devices, the same or similar features of the device can be offered as set forth in preceding paragraphs. Thus, the disclosed subject matter can include providing small semiconductor light-emitting devices having a high reliability, a high light-emitting efficiency and a high light-harvesting efficiency such that can also be used to illuminate goods laid out in a narrow show window, a vending machine, etc.

BRIEF DESCRIPTION OF THE DRAWINGS

These and other characteristics and features of the disclosed subject matter will become clear from the following description with reference to the accompanying drawings, wherein:

FIG. 5a and FIG. 5b are cross-sectional views showing a ray tracing simulation in a position close to a semiconductor light-emitting chip and in another position located in a direction from an encapsulating resin toward a top surface of the encapsulating resin in a comparative embodiment of a conventional semiconductor light-emitting device, respectively;

FIG. 6a and FIG. 6b are cross-sectional views when FIG. 4a and FIG. 5a are shown at a time and also when FIG. 4b and FIG. 5b are shown at a time, respectively;

FIGS. 8a and 8b are partial enlarged top views showing a forming process for forming conductor patterns on the first board and the second board of the base board in the exemplary manufacturing method for the semiconductor light-emitting device, respectively;

FIG. 16a and FIG. 16b are cross-sectional views showing a ray tracing simulation in a position close to a semiconductor light-emitting chip and in another position located in a direction from an encapsulating resin toward the top surface of the encapsulating resin in the second embodiment of the semiconductor light-emitting device shown in FIG. 15 along with the ray tracing simulations of the comparative embodiment shown in FIG. 5a and FIG. 5b at once, respectively;

DETAILED DESCRIPTION OF EXEMPLARY EMBODIMENTS

Figure 1:
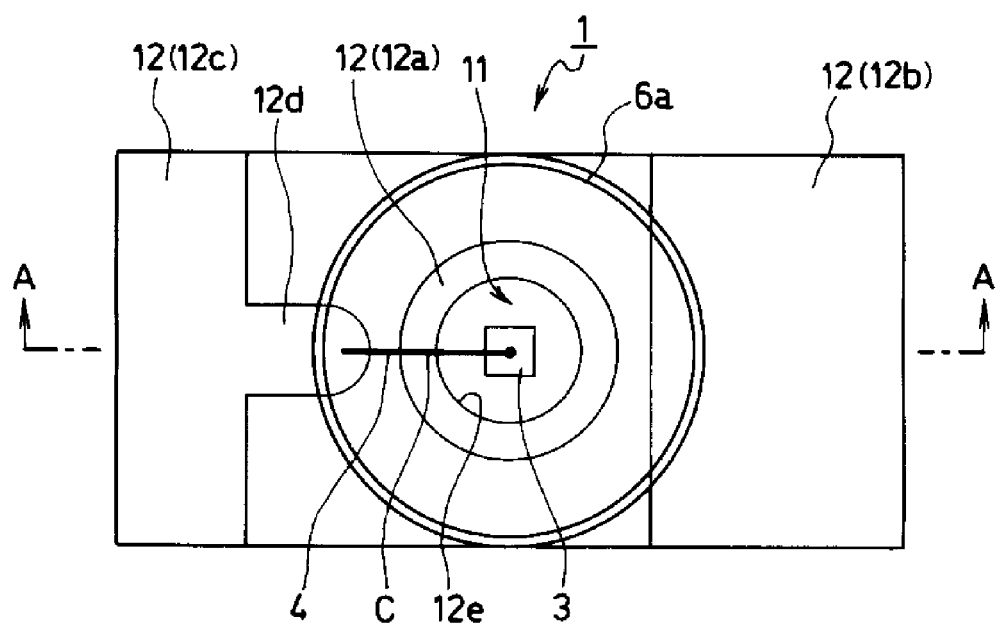
FIG. 1 is an enlarged top view showing a first exemplary embodiment of a semiconductor light-emitting device made in accordance with principles of the disclosed subject matter.
Figure 2:
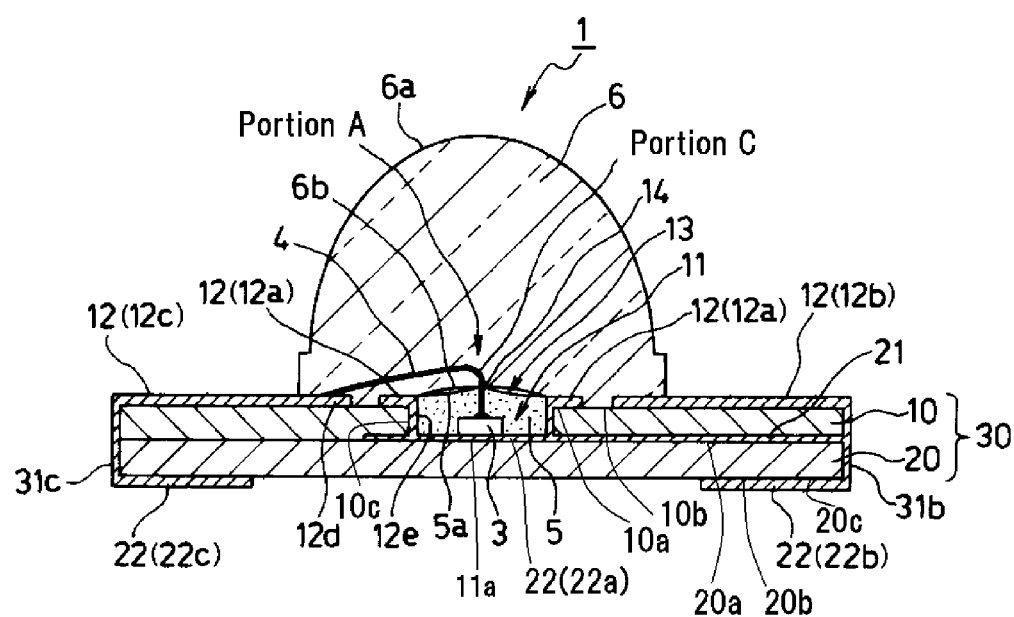
FIG. 2 is an enlarged side cross-sectional view taken along line A-A in FIG. 1 showing the first embodiment of the semiconductor light-emitting device of FIG. 1.

Exemplary embodiments and manufacturing methods of the disclosed subject matter will now be described in detail with reference to FIGS. 1 to 17b, in which the same or corresponding elements use the same reference marks. FIG. 1 is an enlarged top view showing a first exemplary embodiment of a semiconductor light-emitting device made in accordance with principles of the disclosed subject matter, and FIG. 2 is an enlarged side cross-sectional view taken along line A-A in FIG. 1 showing the first embodiment of the semiconductor light-emitting device of FIG. 1.

The semiconductor light-emitting device 1 can include a base board 30 having a cavity 11 with a two layer structure made by attaching a first board 10 having a through hole (11), which is formed in a substantially rectangular tabular shape so that the through hole thereof can form the cavity 11 of the base board 30, on a top surface 20a of a second board 20, which is also formed in a substantially same rectangular tabular shape as the substantially rectangular tabular shape of the first board 10, via an isolating adhesive member 21 such as an isolating adhesive material, an isolating adhesive sheet, etc. A shape of the cavity 11 can be formed in a substantially circular shape in the top view shown in FIG. 1. However, the shape cannot be limited to the circular shape, but can be formed in various shapes such as a substantially square shape, an ellipsoidal shape and the like in accordance with a usage of the device 1.

The first board 10 can be provided with a conductor pattern 12 made from Au (gold) and the like on at least a top surface 10b thereof, the conductor pattern 12 including: a first conductor pattern 12a formed in an annular shape in accordance with the shape of the cavity 11, and surrounding a top edge 10a of the through hole (11) of the first board 10 along the top edge 10a of the through hole (11); a second conductor pattern 12b formed on the top surface 10b of the first board 10, which is located opposite the second board 20, toward a side surface of the first board 10; a third conductor pattern 12c also formed on the top surface 10b of the first board 10, which is located opposite the second conductor pattern 12b, toward another side surface of the first board 10, which is located opposite the side surface of the first board 10; a fourth conductor pattern 12d extending from the third conductor pattern 12c toward the first conductor pattern 12a, isolated from the first conductor pattern 12a and being electrically connected to the third conductor pattern 12c so as to be able to be used as a wire bonding pad; and a fifth conductor pattern 12e formed on an inner surface 10c of the through hole (11) of the first board 10, and being electrically connected to the first conductor pattern 12a.

The second board 20 can also be provided with a conductor pattern 22 made from Au (gold) and the like on at least a top surface 20a thereof so that at least a part of the conductor pattern 22 is located between the first board 10 and the second board 20, the conductor pattern 22 including: a sixth conductor pattern 22a located on a bottom surface 11a of the cavity 11 so as to be able to be used as a die bonding pad, being electrically connected to the first conductor pattern 12a of the first board 10 via the fifth conductor pattern 12e, extending from the bottom surface 11a of the cavity 11 toward a side surface of the second board 20, which is located in a same direction as the side surface of the first board 10 and which is located in an extending direction of the second conductor pattern 12b of the first board 10; a seventh conductor pattern 22b located on a bottom surface 20c of the second board 20, and extending from the bottom surface 20c of the second board 20 in an extending direction of the sixth conductor pattern 22a located toward the side surface of the second board 20; and an eighth conductor pattern 22c also located on the bottom surface 20c of the second board 20, located opposite the seventh conductor pattern 22b and extending from the bottom surface of the second board 20 toward another side surface of the second board 20, which is located in a same direction as the other side surface of the first board 10 and which is located in an extending direction of the third conductor pattern 12c of the first board 12.

In addition, a ninth conductor pattern 31b can be formed on the side surfaces of the first board 10 and the second board 20, and therefore can electrically connect to the second conductor pattern 12b of the first board 10 and the sixth conductor pattern 20a and the seventh conductor pattern 22b of the second board 20 with respect to each other. A tenth conductor pattern 31c can also be formed on the other side surfaces of the first board 10 and the second board 20, and therefore can electrically connect to the third conductor pattern 12c of the first board 10 and the ninth conductor pattern 22c of the second board 20 with respect to each other.

Accordingly, the first conductor pattern 12a, the second conductor pattern 12b and the fifth conductor pattern 12e of the first board 10, and the sixth conductor pattern 22a used as the die bonding pad and the seventh conductor pattern 22b of the second board 20 can be electrically connected via the ninth conductor pattern 31b with respect to each other. The seventh conductor pattern 22b, which is located underneath the bottom surface 20c of the second board 20 in the base board 30, can be used as one electrode of the semiconductor light-emitting device 1.

The third conductor pattern 12c of the first board 10, which connects the fourth conductor pattern 12d used as the wire bonding pad, and the eighth conductor pattern 22c of the second board 20 can be electrically connected via the tenth conductor pattern 31c with respect to each other. Accordingly, the eighth conductor pattern 22c, which is located underneath the bottom surface 20c and which is located opposite the seventh conductor pattern, can be used as another one electrode of the semiconductor light-emitting device 1 in a reflow soldering process.

Figure 3:
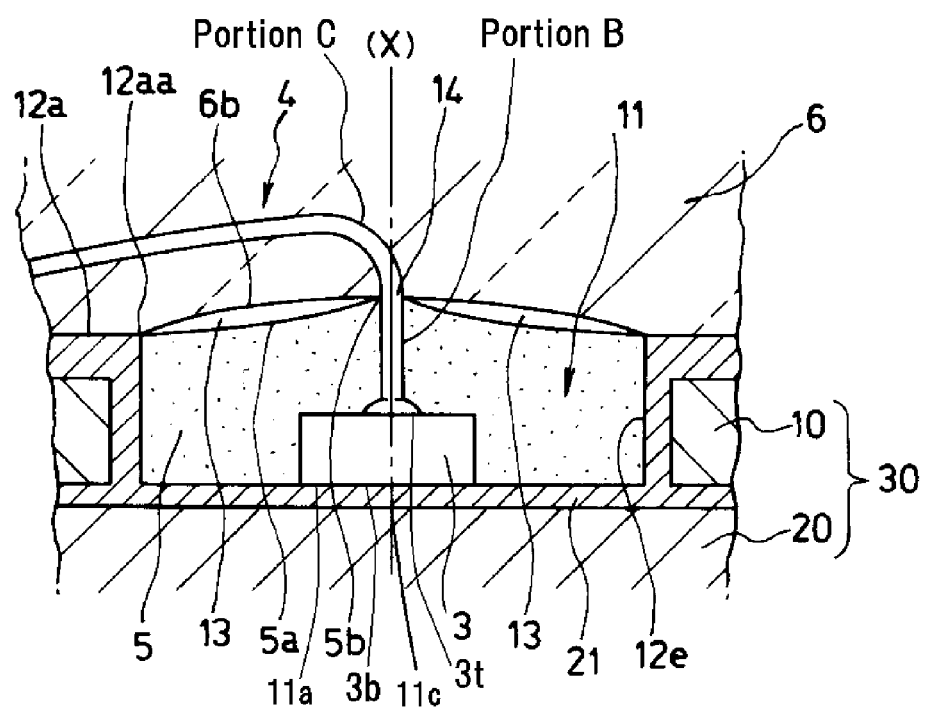
FIG. 3 is a partial enlarged view depicting portion A shown in FIG. 2.

On the sixth conductor pattern 22a, which is formed on the bottom surface 11a of the cavity 11, a semiconductor light-emitting chip 3 having a top electrode 3t and a bottom electrode 3b, as shown in FIG. 3 described later, can be mounted by a die bonding and also the bottom electrode 3b thereof can be electrical connected to the sixth conductor pattern 22a. The top electrode 3t of the semiconductor light-emitting chip 3 can be electrically connected to the fourth conductor pattern 12d via a bonding wire 4, which connects the third conductor pattern 12c of the first board 10.

In this case, the semiconductor light-emitting chip 3 can be mounted at a middle portion of the bottom surface 11a of the cavity 11. However, the semiconductor light-emitting chip 3 cannot necessarily be mounted at the middle portion of the bottom surface 11a of the cavity 11. The bonding wire 4 can be connected between the top electrode 3t, which is located on a top surface of the semiconductor light-emitting chip 3, and the fourth conductor pattern 12d so as to cross a part of the top surface of the semiconductor light-emitting chip 3. Therefore, the bonding wire 4 can be connected between the top electrode and the fourth conductor pattern 12d so as to prevent crossing a light-emitting surface, which is located on the top surface of the semiconductor light-emitting chip 3. However, the bonding wire 4 may across the light-emitting surface of the semiconductor light-emitting chip 3 because the bonding wire 4 is formed in very thin shape.

When the semiconductor light-emitting device 1 is mounted on a mounting circuit board, each of the seventh conductor pattern 22b, which is located on an end portion of the bottom surface 20b and is electrically connected to the bottom electrode 3b of the semiconductor light-emitting chip 3 via the sixth conductor pattern 22a and the ninth conductor pattern 31b, and the eighth conductor pattern 22c, which is located on another end portion of the bottom surface 20b opposite the end portion of the bottom surface 20b and is electrically connected to the top electrode 3t of the semiconductor light-emitting chip 3 via the bonding wire 4, the fourth conductor pattern 12d, the third conductor pattern 12c and the tenth conductor pattern 31c, can be used as the one electrode and the other electrode of the device 1 to receive a power supply.

Therefore, because the semiconductor light-emitting device 1 can be mounted on a mounting circuit board using the seventh conductor pattern 22b and the eighth conductor patter 22c, which are located on a substantially same level with respect to each other, the semiconductor light-emitting device 1 can be mounted on the mounting circuit board with confidence by a reflow soldering method, etc. Additionally, the semiconductor light-emitting chip 3 can receive a power supply from an outside electric power source via the seventh conductor pattern 22b and the eighth conductor patter 22c as described above.

In the cavity 11 mounting the semiconductor light-emitting chip 3, a wavelength converting material 5, which is made by mixing a phosphor with a transparent resin, an inorganic binder and the like in order to be able to emit a wavelength converted light using light emitted from the semiconductor light-emitting chip 3, can be disposed. The wavelength converting material 5 can also encapsulate the semiconductor light-emitting chip 3 and a part of the bonding wire 4, which is located close to the top electrode 3t of the semiconductor light-emitting chip 3.

When the semiconductor light-emitting chip 3 is a blue LED chip having a peak wavelength of 460 nanometers, the wavelength converting material 5 can include the phosphor to convert light emitted from the semiconductor light-emitting chip 3 into a particular wavelength or range of wavelengths of light. The phosphor can be excited by the light emitted from the semiconductor light-emitting chip 3, and can emit the wavelength converted light. Accordingly, the semiconductor light-emitting device 1 can emit a different wavelength from that of the semiconductor light-emitting chip 3 by an additive color mixture of a part of the light emitted from the semiconductor light-emitting chip 3 and the wavelength converted light excited by another part of the light.

The wavelength converting material 5 can be made by mixing a yellow phosphor such as YAG with a transparent resin such as a silicone resin and the like. When the semiconductor light-emitting chip 3 is the blue LED chip having a peak wavelength of 460 nanometers, the yellow phosphor can emit a yellow light upon being excited by blue light emitted from the blue LED chip. The semiconductor light-emitting device 1 can emit substantially white light that can be used as a light source for a vending machine, a back light unit, a show window and the like, by an additive color mixture of the excited yellow light emitted from the yellow phosphor and a part of the blue light emitted from the blue LED chip.

The yellow phosphor can include, $Y_3Al_5O_{12}$: $Ce^{3+}$ (YAG), $(Sr, Ba)_2SiO_4$: $Eu^{2+}$, $Ca_x(Si, Al)_{12}(O, N)_{16}$: $Eu^{2+}$ and the like. In place of the yellow phosphor, a red phosphor wavelength-converting the blue light emitted from the blue LED chip into red-purple light, and a green phosphor wavelength-converting the blue light into blue-green light can also be used. In this case, the semiconductor light-emitting device can emit light having substantially white light by an additive color mixture of the red-purple light emitted from the red phosphor that is excited by the blue light, the blue-green light emitted from the green phosphor that is excited by the blue light and a part of the blue light. The red phosphor can include $CaAlSiN_3$: $Eu^{2+}$, $Ca_2Si_5N_8$: $Eu^{2+}$, $La_2O_2S$: $Eu^{3+}$, $KSiF_6$: $Mn^{4+}$, $KTiF_6$: $Mn^{4+}$ and the like. $Y_3(Ga, Al)_5O_{12}$: $Ce^{3+}$, $Ca_3Sc_2Si_3O_{12}$: $Ce^{3+}$, $CaSc_2O_4$: $Eu^{2+}$, $(Ba, Sr)_2SiO_4$: $Eu^{2+}$, $Ba_3Si_6O_{12}N_2$: $Eu^{2+}$, $(Si, Al)_6(O, N)$: $Eu^{2+}$ and the like can be used as the green phosphor.

The wavelength converting material 5 can be disposed in the cavity 11 so that a top surface 5a thereof is formed from the first conductor pattern 12a toward an intersection 14 of the wire bonding 4 and the wavelength converting material 5 while the top surface 5a banks toward the intersection 14 because of a surface tension generated at a contacting portion of the bonding wire 4 and the wavelength converting material 5 in a potting process described later. Hence, the top surface 5a of the wavelength converting material 5 can be formed in a substantially conical shape, in which a side surface is formed in a substantially concave shape toward the semiconductor light-emitting chip 3.

On the first conductor pattern 12a, a part of the top surface 10a of the first board 10 and parts of tops surfaces of the second conductor pattern 12b and the fourth conductor pattern 12d, an encapsulating resin 6 having a top surface 6a and a bottom surface 6b can be disposed. The encapsulating resin 6 can be composed of a transparent resin having a high transparency such as an epoxy resin, etc. The top surface 6a of the encapsulating resin 6 can be formed in a substantially concave shape toward the top surface 6a because the transparent resin 6 is pulled toward the top surface 6a by a volume constriction during a thermal curing in an encapsulating process described later.

In this case, a space 13 can occur between the bottom surface 6b of the encapsulating resin 6 and the top surface 5a of the wavelength converting material 5 because the bottom surface 6b of the encapsulating resin 6 pulls toward the top surface 6a and because the top surface 5a of the wavelength converting material 5 is formed in the substantially concave shape between the first conductor pattern 12a and the intersection 14 of the wire bonding 4 and the wavelength converting material 5. Additionally, the encapsulating resin 6 can encapsulate another part of the bonding wire 4, which is not encapsulated with the wavelength converting material 5, along with the first conductor pattern 12a, the part of the top surface 10a of the first board 10 and the parts of the tops surfaces of the second conductor pattern 12b and the fourth conductor pattern 12d.

A positional relation between the wavelength converting material 5 and the encapsulating resin 6 will now be described with reference to FIG. 3, which is a partial enlarged view depicting portion A shown in FIG. 2. The wavelength converting material 5 can be disposed in the cavity 11, in which the top surface 5a of the wavelength converting material 5 extends from a substantially inner top edge 12aa of the first conductor pattern 12a toward the intersection 14 of the bonding wire 4 and the wavelength converting material 5. The top surface 5a of the wavelength converting material 5 can bank from the substantially inner top edge 12aa of the first conductor pattern 12a toward the intersection 14 because of a surface tension generated at the contacting portion of the bonding wire 4 and the wavelength converting material 5.

Accordingly, the top surface 5a of the wavelength converting material 5 can be formed in the substantially conical shape having the side surface formed in the substantially concave shape. Portion B shows the part of the bonding wire 14, which is encapsulated by the wavelength converting material 5 and which is located between the top electrode 3t of the semiconductor light-emitting chip 3 and an apex angle 5b of the top surface 5a of the wavelength converting material 5. The bottom electrode 3b of the semiconductor light-emitting chip 3, which is encapsulated with the wavelength converting material 5, can be electrically connected to the sixth conductor pattern 22a by the die bonding as described above.

The encapsulating resin 6 can cover at least the wavelength converting material 5 and the first conductor pattern 12a along with the other part of the bonding wire 14, which is not encapsulated with the wavelength converting material 5. In the thermal curing process of the encapsulating process, because the encapsulating resin 6 is pulled toward the top surface 6a while the bottom surface 6b is formed in the substantially concave shape toward the top surface 6a and because the top surface 5a of the wavelength converting material 5 is also formed in the substantially concave shape toward the semiconductor light-emitting chip 3, the space 13 can occur between the bottom surface 6b of the encapsulating resin 6 and the top surface 5a of the wavelength converting material 5.

Therefore, at an intersection 5b of the encapsulating resin 6 and the wavelength converting material 5, where is also the apex angle of the top surface 5a of the wavelength converting material 5, the encapsulating resin 6 and the wavelength converting material 5 can intersect with respect to each other. In other words, the bottom surface 6b of the encapsulating resin 6 and the top surface 5a of the wavelength converting material 5 can intersect with the intersection 14 of the wavelength converting material 5 and the bonding wire 4 with respect to each other while the space 13 is formed between the bottom surface 6b of the encapsulating resin 6 and the top surface 5a of the wavelength converting material 5 and between the substantially inner top edge 12aa of the first conductor pattern 12a and the intersection 14 of the wavelength converting material 5 and the bonding wire 4.

The intersection 14 can be located on a substantially optical axis (X) of the semiconductor light-emitting device 1, which intersects with a center 11c of the bottom surface 11a of the cavity 11 and the sixth conductor pattern 22a formed on the bottom surface 11a of the cavity 11 at a substantially right angle. The bonding wire 4 can extend on the substantially optical axis (X) of the device 1 from the top electrode 3t of the semiconductor light-emitting chip 3 toward the intersection 14, and also can extend from the intersection 14 toward the fourth conductor pattern 12d in a curved fashion, as shown in Portion C of FIG. 3.

When the bonding wire 4 corresponds to the substantially optical axis (X) of the device 1, a cross-sectional shape of the space 13 taken along an imaginary plane, which intersects with the substantially optical axis (X) located between the intersection 14 and the top electrode 3t of the semiconductor light-emitting chip 3, can be formed in a substantially symmetric shape.

As the encapsulating resin 6 including the top surface 6a, which is used as a light-emitting surface of the device 1, a transparent material having a high permeability such as an epoxy resin can be used to improve a light-emitting efficiency. A transparent resin having a high thermal resistance such as a silicone resin can be used as the transparent resin for the wavelength converting material 5 so as to prevent a degradation of the wavelength converting material 5 due to a heat generated from the semiconductor light-emitting chip 3 during operation, even if a thermal expansion coefficient of the encapsulating resin 6 may be extremely different from that of the silicone resin, which has the high thermal resistance so as to be able to maintain a high reliability of the device 1.

In the first embodiment of the disclosed subject matter, an epoxy resin having a thermal expansion coefficient of 67 parts per million (PPM)/degree centigrade (degree C.) is used as the encapsulating resin 6, and a silicon resin having a thermal expansion coefficient of 300 PPM/degree C., which is approximately five times the thermal expansion coefficient of the encapsulating resin, can be used as the transparent resin for the wavelength converting material 5.

When the semiconductor light-emitting device 1 having such a structure is mounted on the mounting circuit board using lead-free soldering having a melting point of approximately 260 degree C. in the reflow soldering process, values of the encapsulating resin 6 and the wavelength converting material 5 disposed in the cavity 1 expand because of a thermal expansion. Accordingly, the bottom surface 6b of the encapsulating resin 6 may extend toward the wavelength converting material 5, and also the top surface 5a of the wavelength converting material 5 may extend toward the encapsulating resin 6.

However, even when each of the bottom surface 6b of the encapsulating resin 6 and the top surface 5a of the wavelength converting material 5 may extend in an approaching direction with respect to each other at once, each of the bottom surface 6b of the encapsulating resin 6 and the top surface 5a of the wavelength converting material 5 cannot contact with respect to each other due to the space 13. Therefore, each stress of an expansion and a contraction cannot remain in each of the encapsulating resin 6 and the wavelength converting material 5 during/after the reflow soldering process.

Even if each of the bottom surface 6b of the encapsulating resin 6 and the top surface 5a of the wavelength converting material 5 contacts with respect to each other because the space 13 is formed in a narrow shape, the stress of the encapsulating resin 6 caused by the expansion of the wavelength converting resin 5 may be very weak. That is because the stress of the encapsulating resin 6 can be relieved until the top surface 5a of the wavelength converting material 5 gets to a total extent of the bottom surface 6b of the encapsulating resin 6.

Accordingly, the semiconductor light-emitting device 1 can extremely reduce the stress caused between the wavelength converting material 5 and the encapsulating resin 6 as compared with a case, where the top surface 5a of the wavelength converting material 5 contacts with the bottom surface 6b of the encapsulating resin 6. In other words, even if the semiconductor light-emitting device 1 is exposed to a high temperature of approximately 260 degrees C., the stress caused between the wavelength converting material 5 and the encapsulating resin 6, which have extremely different thermal expansion coefficients with respect to each other, can be extremely decreased due to the space 13, as compared with that in the case where the wavelength converting material 5 contacts with the encapsulating resin 6.

Therefore, the disclosed subject matter can provide reliable semiconductor light-emitting devices, which can prevent a crack generated between the wavelength converting material 5 and the encapsulating resin 6 because of the extremely different thermal expansion coefficients thereof by forming the space 13. Additionally, because the space 13 can be formed in the substantially symmetric shape in the cross-sectional shape thereof taken along the imaginary plane, which intersects with the substantially optical axis (X) of the device 1, the semiconductor light-emitting device 1 can emit light having a substantially symmetric directional light distribution with respect to the optical axis (X) of the device 1.

Figure 4A:
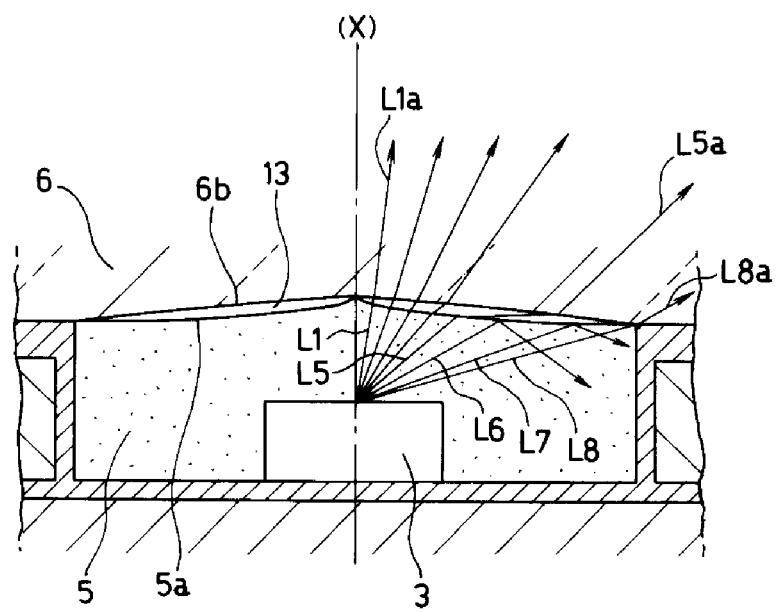
FIG. 4a and FIG. 4b are cross-sectional views showing a ray tracing simulation in a position close to a semiconductor light-emitting chip and in another position located in a direction from an encapsulating resin toward a top surface of the encapsulating resin in the first embodiment of the semiconductor light-emitting device shown in FIG. 1 and FIG. 2, respectively.
Figure 4B:
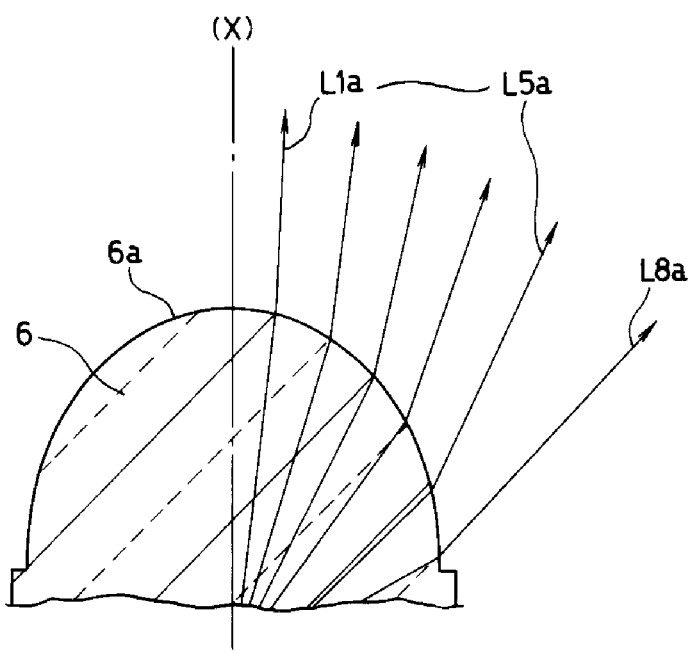

FIG. 4a and FIG. 4b are cross-sectional views showing a ray tracing simulation in a position close to the semiconductor light-emitting chip 3 and in another position located in a direction from the encapsulating resin 6 toward the top surface 6a of the encapsulating resin 6 in the first embodiment. Among Rays L1 to L8 emitted from a middle portion of the top surface of the semiconductor light-emitting chip 3, which get to the top surface 5a of the wavelength converting material 5, each of Rays L1 to L5 and L8 can enter into the encapsulating resin 6 as Rays L1a to L5a and L8a after being refracted on the top surface 5a of the wavelength converting material 5, passing through the space 13 and being refracted on the bottom surface 6b of the encapsulating 6, respectively.

Rays L1a to L5a and L8a can be emitted in an outward direction of the encapsulating resin 6 after being refracted in a direction toward the optical axis (X) on the top surface 6a of the encapsulating resin 6. Rays L6 and L7 may be reflected on the top surface 5a of the wavelength converting material 5, and may return into the wavelength converting material 5.

FIG. 5a and FIG. 5b are cross-sectional views showing a ray tracing simulation in a position close to a semiconductor light-emitting chip and in another position located in a direction from an encapsulating resin toward a top surface of the encapsulating resin in a comparative embodiment of a conventional semiconductor light-emitting device, respectively. A difference between the first embodiment and the comparative embodiment relates to the shape of the top surface 5a of the wavelength converting material 5. A top surface 5a' of the wavelength converting material 5 is formed in a slightly convex shape and, therefore a space 13' is formed in a slightly thinner shape than that of the first embodiment.

In the comparative embodiment shown in FIG. 5a and FIG. 5b, among Rays L1 to L8 emitted from a middle portion of the top surface of the semiconductor light-emitting chip 3, each of Rays L1 to L4 and L8 can enter into the encapsulating resin 6 as Rays L1b to L4b and L8b after being refracted on the top surface 5a' of the wavelength converting material 5, passing through the space 13' and being refracted on the bottom surface 6b of the encapsulating 6, respectively. Rays L1b to L5b and L8b can be emitted in the outward direction of the encapsulating resin 6 after being refracted in a direction toward the optical axis (X) on the top surface 6a of the encapsulating resin 6. Rays L5 to L7 may be reflected on the top surface 5a' of the wavelength converting material 5, and may return into the wavelength converting material 5.

FIG. 6a and FIG. 6b show FIG. 4a and FIG. 5a, and FIG. 4b and FIG. 5b at a time, respectively. The number of Rays emitted from the first embodiment can be larger than that of Rays emitted from the comparative embodiment. Rays returning into the wavelength converting material may be emitted in the outward direction of the encapsulating resin 6 after repeating some reflections on the first conductor pattern 12a, etc. However, because path lengths of Rays 5 to 7 repeating reflections in the cavity 11 may become longer, a light-emitting intensity of Rays 5 to 7 may reduce until being emitted from the top surface 6a of the encapsulating resin 6. Therefore, a light-emitting intensity of the first embodiment can be higher than that of the comparative embodiment.

In addition, Rays L1a to L4a can tend to be emitted from a direction toward the optical axis (X) as compared with Rays L1b to L4b emitted from the comparative embodiment as shown in FIGS. 6a and 6b. Therefore, the semiconductor light-emitting device 1 of the disclosed subject matter can emit light having a high light-harvesting efficiency and a high light-emitting intensity.

The light having a high light-emitting intensity and a high light-harvesting efficiency may relate to a shape of the top surface 5a of the wavelength converting material 5. Although the top surface 5a' of the wavelength converting material 5 in the comparative embodiment is formed in the slightly convex shape, the top surface 5a of the wavelength converting material 5 in first embodiment can be formed in the substantially conical shape so as to bank along the bonding wire 4 due to the surface tension of the contact portion between the wavelength converting material 5 and the bonding wire 4. The top surface 5a of the wavelength converting material 5 can be formed in the substantially shape toward the semiconductor light-emitting chip 3, as described above.

Accordingly, when the shape of the top surface 5a of the wavelength converting material 5 in the first embodiment is compared with the shape of the top surface 5a' in the comparative embodiment, an incident angle of light emitted from the middle portion of the top surface of the semiconductor light-emitting chip 3 on the top surface 5a of the first embodiment with respect to a normal line can be basically smaller than that of the light emitted from the middle portion of the top surface of the semiconductor light-emitting chip 3 on the top surface 5a' of the comparative embodiment with respect to the normal line.

That is to say, when the light emitted from the middle portion of the top surface 5a of the semiconductor light-emitting chip 3 gets to the top surface 5a of the wavelength converting material 5 within a range of an optimum angle, a range of a light-emitting angle of the light emitted from the semiconductor light-emitting chip 3 in the first embodiment can be larger than that of an light-emitting angle of the light in the comparative embodiment. Accordingly, the first embodiment can enter rays emitted from a wide range of the semiconductor light-emitting chip 3 into the encapsulating resin 6 as compared with the comparative embodiment, and therefore can improve the light-emitting efficiency by reducing internal reflections on the top surface 5a of the wavelength converting material 5.

In addition, because the incident angle of the light emitted from the middle portion of the top surface of the semiconductor light-emitting chip 3 on the top surface 5a of the first embodiment with respect to the normal line can be basically smaller than that of the light emitted from the middle portion of the top surface of the semiconductor light-emitting chip 3 on the top surface 5a' of the comparative embodiment with respect to the normal line, the light can be emitted in an approaching direction of the optical axis (X) of the device 1. As a result, the first embodiment can emit light having a higher light-harvesting efficiency than light having a light-harvesting efficiency of the comparative embodiment.

Figure 7A:
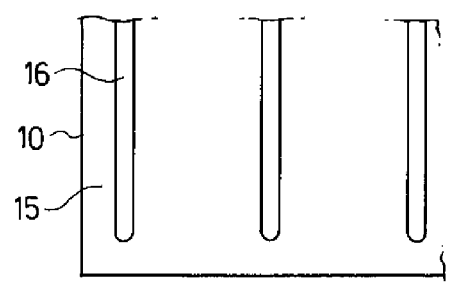
FIGS. 7a and 7b are partial enlarged top views showing a preparing process of a first board and a second board of a base board in an exemplary manufacturing method for the semiconductor light-emitting device shown in FIG. 1 and FIG. 2, respectively.
Figure 7B:
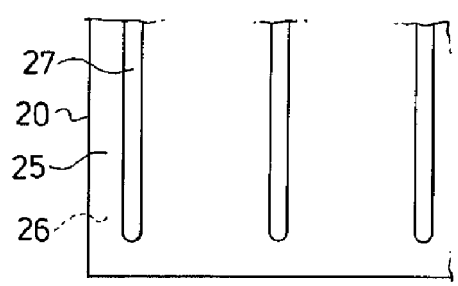

Methods for manufacturing the semiconductor light-emitting device 1 will now be described with reference to FIG. 7 to FIG. 14. FIGS. 7a and 7b are partial enlarged top views showing a preparing process of the first board 10 and the second board 20 of the base board 30 in manufacturing methods for the semiconductor light-emitting device 1 shown in FIG. 1 and FIG. 2, respectively.

Process 1 is preparing a first large board (e.g., a glass epoxy board) including a plurality of the first boards 10 and a plurality of through holes 16 being aligned parallel to each other at a predetermined interval, wherein a thin metallic layer 15 is formed on a whole top surface of the first large board, and preparing a second large board (e.g., a glass epoxy board) including a plurality of the second boards 20 and a plurality of through holes 27 being aligned parallel to each other at a predetermined interval, wherein thin metallic layers 25 and 26 are formed on a whole top surface and a whole bottom surface of the second large board, respectively.

Process 2 is forming the conductor pattern 12 on the top surface of the first large board including the plurality of the first boards 10 by removing unnecessary parts of the thin metallic layer 15 using an etching method, and forming the conductor pattern 22 on the top and the bottom surfaces of the second large board including the plurality of the second boards 20 by removing unnecessary parts of the thin metallic layers 25 and 26 using an etching method, respectively, as shown in FIGS. 8a and 8b.

In this forming process, each of middle metallic patterns 17, which is formed in a circular shape, can align at a respective one of middle portions between the adjacent through holes 16 in a linear fashion at a predetermined interval and also can be isolated with respect to each other so that the surface metallic patterns (12) can become the first conductor pattern 12a, which is formed in the annular shape. Surface edge metallic patterns (12b), which connects other surface edge metallic patterns (12c) to be able to become the second conductor pattern 12b and the third conductor pattern 12c in later, can be formed at both sides of each of the middle metallic patterns 17, which is formed in the linear fashion. Bonding wire pads (12d) can extend from the other surface edge metallic patterns (12c) toward each of the middle metallic patterns 17 to be able to become the fourth conductor pattern 12d. Each center of the middle metallic patterns 17 can be located on a substantially imaginary central line between the opposite though holes 16.

Meanwhile, each of top surface metallic patterns (22a) of the second large board (20), which become the sixth conductor pattern 22a formed on the top surface 20a of the second board 20 described above, can be aligned parallel to each other at a predetermined interval so as to extend from each of the through holes 27 toward the opposite through hole 27. Bottom surface metallic patterns (22) of the second large board (20), which become the seventh conductor pattern 22b and the eighth conductor pattern 22c described above, can be formed in a respective one of rectangular shapes having a predetermined width so as to surround the each of the through holes 27 and so as to be aligned parallel to each other.

Figure 9:
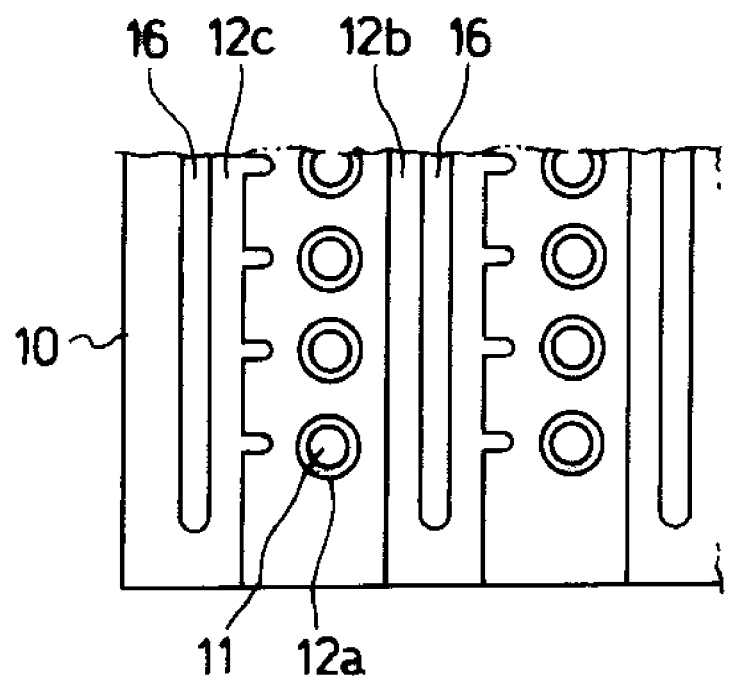
FIG. 9 is a partial enlarged top view showing a through-hole-forming process for forming a first conductor pattern by forming through holes passing through the first base in the exemplary manufacturing method for the semiconductor light-emitting device.

Process 3 is forming through holes 11, which pass through the first large board (10) including the middle metallic patterns 17 and thereby change each of the middle metallic patterns 17 formed in the circular shape into a ring shape, and which are formed as a concentric circle with respect to a respective one of the middle metallic patterns 17 so that each of the first conductor patterns 12a can be formed in a substantially ring shape having a substantially width that surrounds a respective one of the through holes 11, as shown in FIG. 9.

Figure 10:
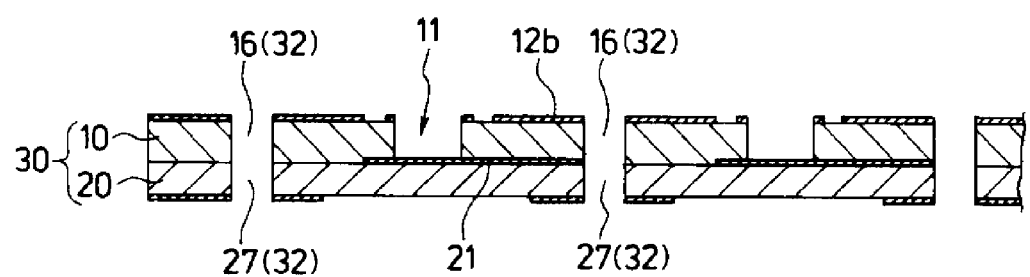
FIG. 10 is a partial enlarged cross-sectional view depicting an attaching process for making the base board by attaching the first board to the second board in the exemplary manufacturing method for the semiconductor light-emitting device.

Process 4 is attaching the first large board (10) on the second large board (20) via the isolating adhesive member 21 such as the isolating adhesive sheet and the like while each of through holes 16 of the first large board (10) can continuously overlap a respective one of the though holes 27 of the second large board (20), and thereby a large base board (30) having cavities 11 and through holes 32 is formed, as shown in FIG. 10.

Figure 11:
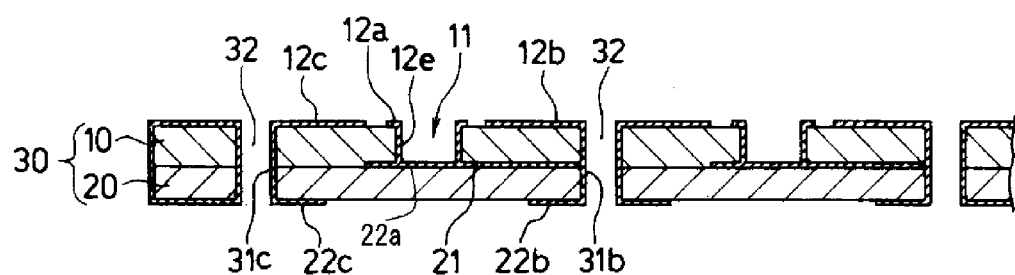
FIG. 11 is a partial enlarged cross-sectional view depicting a plating process for forming a fifth conductor pattern on a through hole of the first board and a ninth conductor pattern and a tenth conductor pattern on a through hole of the base board in the exemplary manufacturing method for the semiconductor light-emitting device.

Process 5 is forming the fifth conductor patterns 12e on side surfaces of the cavities 11 of the first large board (10), and is forming the ninth conductor pattern 31b and the tenth conductor patterns 31c on respective ones of side surfaces of the through holes 32 of the large base board (30), as shown in FIG. 11.

Figure 12:
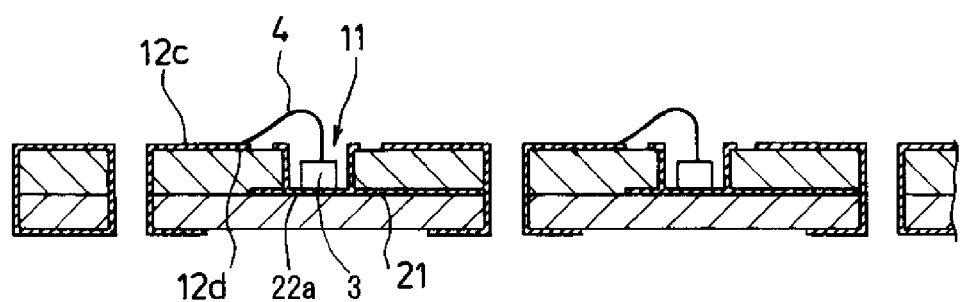
FIG. 12 is a partial enlarged cross-sectional view depicting a bonding process for a semiconductor light-emitting chip in the exemplary manufacturing method for the semiconductor light-emitting device.

Process 6 is die-bonding the semiconductor light-emitting chip 3 on the sixth conductor pattern 23a while the bottom electrode 3b of the chip 3 is electrically connected to the sixth conductor pattern 23a via an electro-conductive adhesive material, and is electrically bonding between the top electrode 3t of the chip 3 and the third conductor pattern 12c via the bonding wire 4, as shown in FIG. 12.

Figure 13:
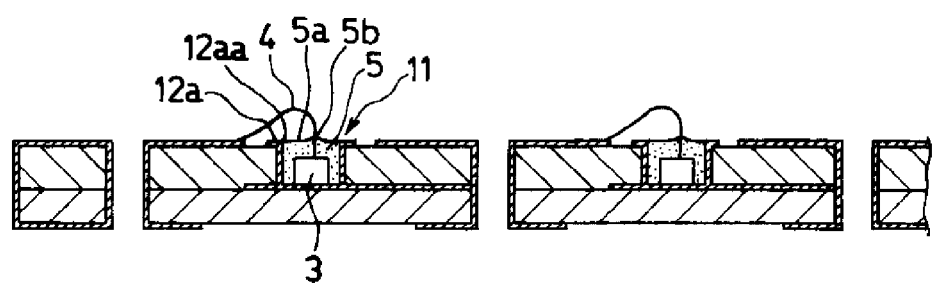
FIG. 13 is a partial enlarged cross-sectional view depicting a potting process for disposing a wavelength converting material in a cavity in the exemplary manufacturing method for the semiconductor light-emitting device.

Process 7 is disposing an uncured wavelength converting material in the cavity 11 and solidifying the uncured wavelength converting material under a prescribed temperature. In this potting process, the uncured wavelength converting material (5) can be disposed in the cavity 11, in which a top surface (5a) of the uncured wavelength converting material (5) extends from the substantially inner top edge 12aa of the first conductor pattern 12a toward the intersection 14 (5b) of the bonding wire 4 and the wavelength converting material 5, and thereby the top surface 5a of the wavelength converting material 5 can bank from the substantially inner top edge 12aa toward the intersection 14 (5b) because of a surface tension generated at the contacting portion of the bonding wire 4 and the wavelength converting material 5, as shown in FIG. 13.

Figure 14:
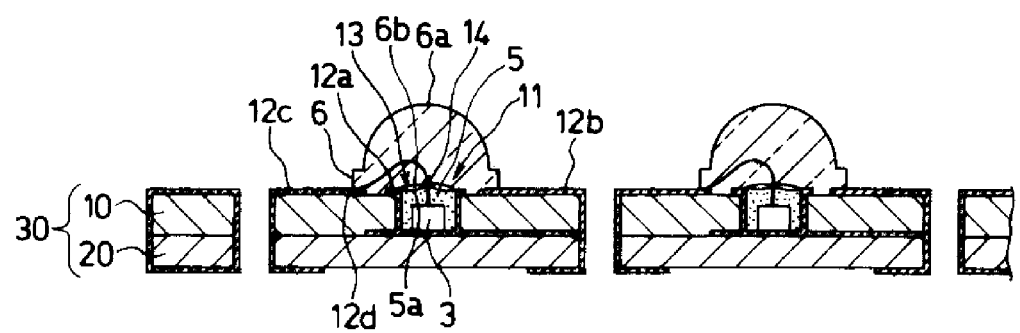
FIG. 14 is a partial enlarged cross-sectional view depicting an encapsulating process to form an encapsulating resin in the exemplary manufacturing method for the semiconductor light-emitting device.

Process 8 is casting an uncured encapsulating resin on at least the wavelength converting material 5 and the first conductor pattern 12a along with the other part of the bonding wire 14, which is not encapsulated with the wavelength converting material 5, using a transfer molding method, etc. In a thermal curing process of the above-described process, the space 13 can occur between the bottom surface 6b of the encapsulating resin 6 and the top surface 5a of the wavelength converting material 5 because the encapsulating resin 6 is pulled toward the top surface 6a while the bottom surface 6b is formed in the substantially concave shape toward the top surface 6a and because the top surface 5a of the wavelength converting material 5 is also formed in the substantially concave shape toward the semiconductor light-emitting chip 3, as shown in FIG. 14.

Process 9 is dicing the large base board (30) into a prescribed shape of the device 1, and is finishing each of the semiconductor light-emitting devices.

Figure 15:
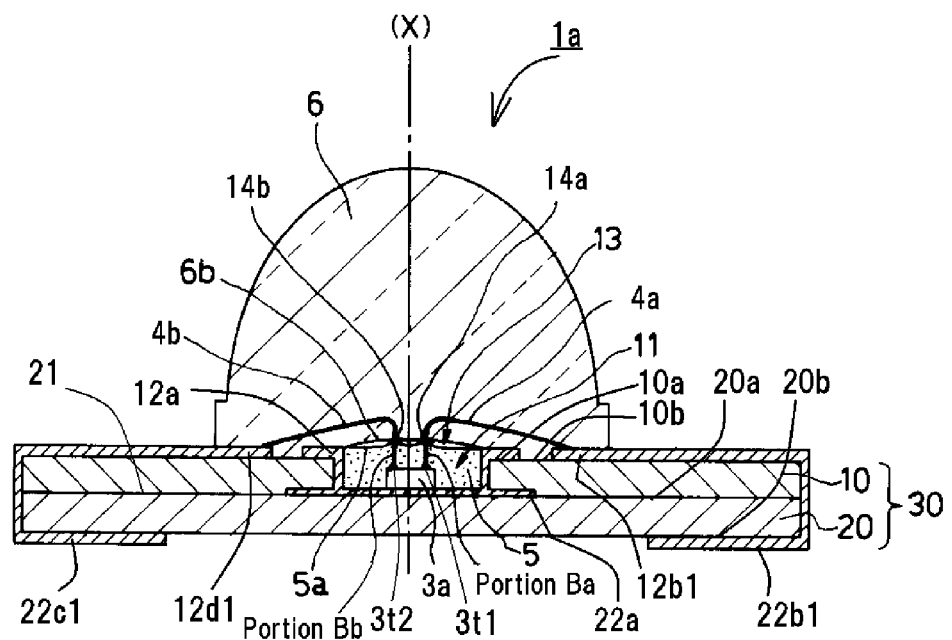
FIG. 15 is an enlarged cross-sectional view showing a second exemplary embodiment of the semiconductor light-emitting device made in accordance with principles of the disclosed subject matter.

An exemplary second embodiment of the disclosed subject matter will now be described in detail with reference to FIG. 15 to FIG. 16b. FIG. 15 is an enlarged cross-sectional view showing the second exemplary embodiment of the semiconductor light-emitting device made in accordance with principles of the disclosed subject matter.

The semiconductor light-emitting device 1a can include the base board 30 having the cavity 11 with the two layer structure made by attaching the first board 10 having the hole, which is formed in the substantially rectangular tabular shape so that the hole thereof can form the cavity 11 in the base board 30, to the second board 20, which is also formed in the substantially same rectangular tabular shape as the substantially rectangular tabular shape of the first board 10, via the isolating adhesive member 21 in common with the semiconductor light-emitting device 1 of the first embodiment.

The semiconductor light-emitting device 1a can also include: a first bonding pattern 12b1 formed on the top surface 10b of the first base board 10; a first electrode 22b1 formed underneath the bottom surface 20b of the second board 20 and being electrically connected to the first bonding pattern 12b1 so as to be able to be used as an electrode of the device 1a; a second bonding pattern 12d1 formed on the top surface 10b of the first base board 10; a second electrode 22c1 formed underneath the bottom surface 20b of the second board 20 and being electrically connected to the second bonding pattern 12d1 so as to be able to be used as another electrode of the device 1a; the first conductor pattern 12a formed on the top surface 10b of the first base board 10 and formed in the annular shape; and the sixth conductor pattern 22a on the bottom surface of the cavity 11.

In addition, the semiconductor light-emitting device 1a of the second embodiment can also include a semiconductor light-emitting chip 3a having a first top electrode 3t1 and a second top electrode 3t2 mounted on the bottom surface of the cavity 11, the first top electrode 30 being electrically connected to the first bonding pattern 12b1 via a first bonding wire 4a, which connects the first electrode 22b1 used as the electrode of the device 1a, the second top electrode 3t2 being electrically connected to the second bonding pattern 12d1 via a second bonding wire 4b, which connect the second electrode 22c1 used as the other electrode of the device 1a to receive a power supply for emitting light from the semiconductor light-emitting chip 3a.

In the semiconductor light-emitting device 1a of the second embodiment, which is manufactured by the above-described manufacturing method, the wavelength converting material 5 can be disposed in the cavity 11, in which the top surface 5a of the wavelength converting material 5 extends from the substantially inner top edge 12aa of the first conductor pattern 12a toward each of intersections 14a and 14b of the first bonding wire 4a and the second bonding wire 4b and the wavelength converting material 5. The top surface 5a of the wavelength converting material 5 can bank from the substantially inner top edge 12aa of the first conductor pattern 12a toward each of the intersections 14a and 14b because of surface tensions generated at contacting portions of the first and the second bonding wires 4a and 4b and the wavelength converting material 5.

Accordingly, the top surface 5a of the wavelength converting material 5 can be formed in two substantially conical shapes with reference to the first top electrode 3t1 and the second top electrode 3t2 of the semiconductor light-emitting chip 3a. Each of Portion Ba and Portion Bb shows parts of the first bonding wire 4a and the second bonding wire 4b, which are encapsulated by the wavelength converting material 5 and which are located from the first top electrode 3t1 and the second top electrode 3t2 of the semiconductor light-emitting chip 3a toward the intersections 14a and 14b of the first bonding wire 4a and the second bonding wire 4b and the wavelength converting material 5, respectively.

The encapsulating resin 6 can cover at least the wavelength converting material 5 and the first conductor pattern 12a along with the other parts of the first bonding wire 4a and the second bonding wire 4b, which is not encapsulated with the wavelength converting material 5. In the thermal curing process of the encapsulating process, because the encapsulating resin 6 is pulled toward the top surface 6a while the bottom surface 6b is formed in a concave shape toward the top surface 6a and because the top surface 5a of the wavelength converting material 5 is also formed in concave shapes toward the semiconductor light-emitting chip 3a, the space 13 can occur between the bottom surface 6b of the encapsulating resin 6 and the top surface 5a of the wavelength converting material 5 in common with the first embodiment.

Therefore, the encapsulating resin 6 and the wavelength converting material 5 can intersect with respect to each other at the intersections 14a and 14b, and the space 13 can be formed between the bottom surface 6b of the encapsulating resin 6 and the top surface 5a of the wavelength converting material 5, and between the inner top edge 12aa of the first conductor pattern 12a and the intersections 14a and 14b and between the intersections 14a and 14b. Thereby, the second embodiment of the disclosed subject matter can also provide reliable semiconductor light-emitting devices, which can prevent a crack generated between the wavelength converting material 5 and the encapsulating resin 6 because of the extremely different thermal expansion coefficients thereof by forming the space 13.

FIG. 16a and FIG. 16b are cross-sectional views showing a ray tracing simulation in a position close to the semiconductor light-emitting chip 3a and in another position located in a direction from the encapsulating resin 6 toward the top surface 6a of the encapsulating resin 6 in the second embodiment shown in FIG. 15 along with the ray tracing simulations of the comparative embodiment shown in FIG. 5a and FIG. 5b at once, respectively.

Among Rays L9 to L14 emitted from a middle portion of the top surface of the semiconductor light-emitting chip 3a, which get to the top surface 5a of the wavelength converting material 5, each of Rays L9 to L13 can enter into the encapsulating resin 6 as Rays L9a to L13a after being refracted on the top surface 5a of the wavelength converting material 5, passing through the space 13 and being refracted on the bottom surface 6b of the encapsulating 6, respectively.

Rays L9a to L13a can be emitted in the outward direction of the encapsulating resin 6 after being refracted in a direction toward the optical axis (X) on the top surface 6a of the encapsulating resin 6. Ray L14 may be reflected on the top surface 5a of the wavelength converting material 5, and may return into the wavelength converting material 5. Ray L14 returning into the wavelength converting material 5 may be emitted in the outward direction of the encapsulating resin 6 after repeating some reflections in the cavity 11, etc.

The number of Rays emitted from the second embodiment can be larger than that of Rays emitted from the comparative embodiment. Therefore, a light-emitting intensity of the second embodiment can also be higher than that of the comparative embodiment. Additionally, Rays L9a to L13a can tend to be emitted from the direction toward the optical axis (X) as compared with Rays L9b to L12b emitted from the comparative embodiment as shown in FIGS. 16a and 16b. Accordingly, the semiconductor light-emitting device 1a of the disclosed subject matter can also emit light having a high light-harvesting efficiency and a high light-emitting intensity in addition to having a reliable structure.

Figure 17A:
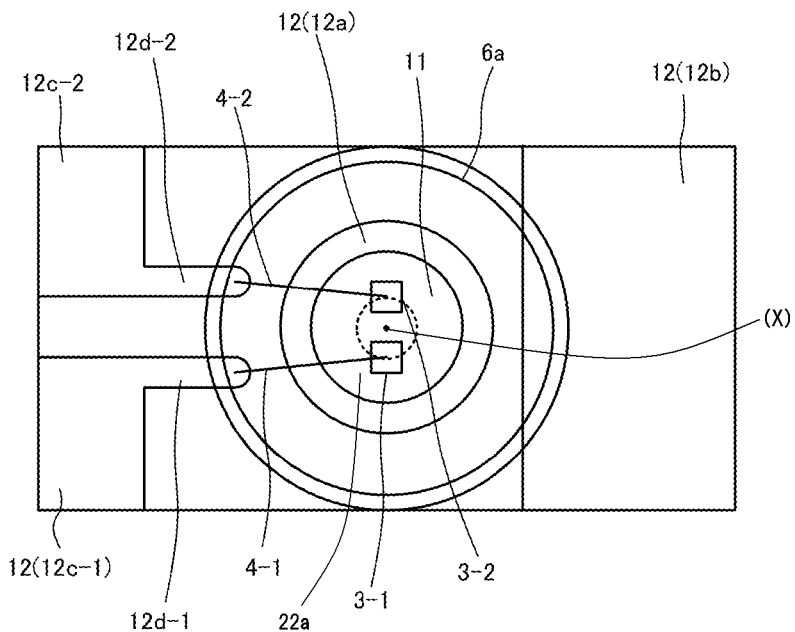
FIG. 17a and FIG. 17b are enlarged top views showing an exemplary first embodiment using a plurality of a semiconductor light-emitting chips and an exemplary second embodiment using a plurality of semiconductor light-emitting chips of a semiconductor light-emitting device made in accordance with principles of the disclosed subject matter, respectively.

FIG. 17a is an enlarged top view showing an exemplary first embodiment using a plurality of semiconductor light-emitting chips of a semiconductor light-emitting device made in accordance with principles of the disclosed subject matter. In this case, for example, the third conductor pattern 12c can be divided into separate two third patterns 12c-1 electrically connected to a first bonding pad 12d-1 and 12c-2 electrically connected to a second bonding pad 12c-2, and two semiconductor light-emitting chips 3-1 and 3-2 can be mounted on the sixth conductor pattern 22 so as to be symmetrical with respect to the optical axis (X) of the semiconductor light-emitting device 1c. Each of top electrodes of the semiconductor light-emitting chips 3-1 and 3-2 can be electrically connected to the first and the second bonding pad 12d-1 and 12d-2 via bonding wires 4-1 and 4-2, respectively.

In addition, each of the top electrodes of the semiconductor light-emitting chips 3-1 and 3-2 can be located on a substantially imaginary circle, in which the optical axis (X) of the semiconductor light-emitting device 1c is central to the imaginary circle. Thereby, the top surface 5a of the wavelength converting material 5 can be formed in balanced concave shapes while the space 13 is also formed in a balanced shape. Thus, the disclosed subject matter can provide the semiconductor light-emitting device 1c using the plurality of semiconductor light-emitting chips having a reliable structure, which can emit a wavelength converted light having a higher light-emitting efficiency and a high light-harvesting efficiency.

Figure 17B:
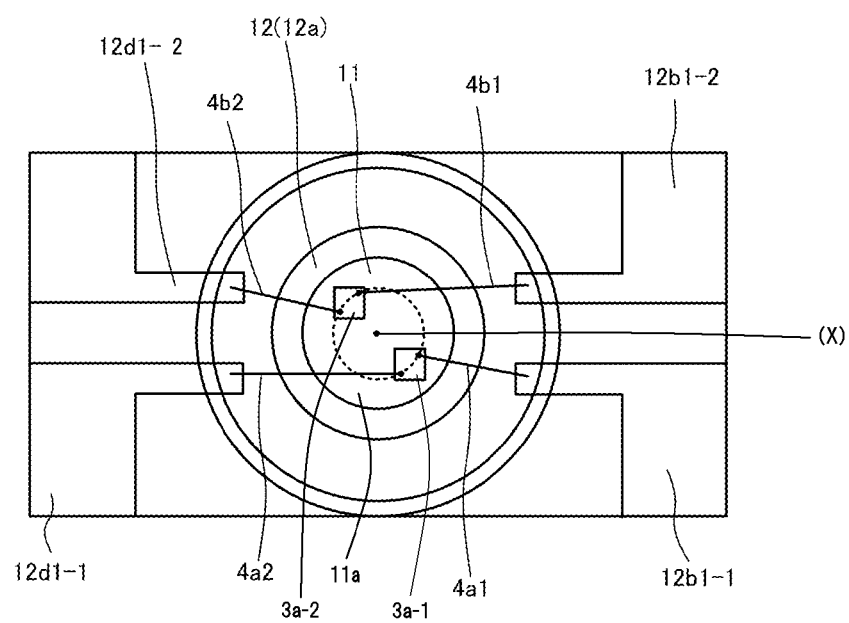
Figure 18A:
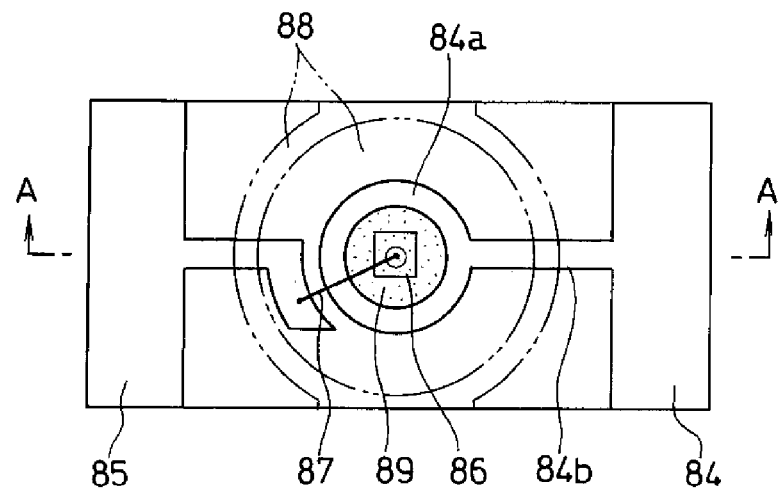
FIGS. 18a and 18b are an enlarged top view and an enlarged side cross-sectional view taken along line A-A in FIG. 18a showing a conventional semiconductor light-emitting device, respectively.
Figure 18B:
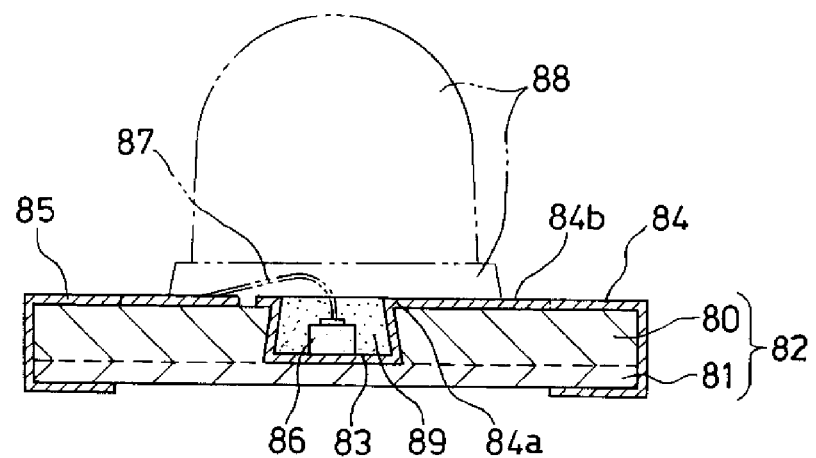

FIG. 17b is an enlarged top view showing an exemplary second embodiment using a plurality of semiconductor light-emitting chips of a semiconductor light-emitting device made in accordance with principles of the disclosed subject matter. In this case, for example, the second conductor pattern 12b can be divided into separate two second patterns 12b1-1 and 12b1-2, in which each can be used as a first bonding pad, and the third conductor pattern 12d can be divided into separate two third conductor patterns 12d1-1 and 12d1-2, in which each can be used as a second bonding pad. Two semiconductor light-emitting chips 3a-1 and 3a-2 can be mounted on the bottom surface 11a of the cavity 11 so as to be symmetrical with respect to the optical axis (X) of the semiconductor light-emitting device 1d. Each of top electrodes of the semiconductor light-emitting chips 3a-1 and 3a-2 can be electrically connected to the first and the second bonding pads 12b-1, 12b-2 and 12d1-1, 12d1-2 via bonding wires 4a1, 4b1 and 4a2, 4b2 respectively.

In addition, each of the top electrodes of the semiconductor light-emitting chips 3a-1 and 3a-2 can be located on a substantially imaginary circle, in which the optical axis (X) of the semiconductor light-emitting device 1d is central to the imaginary circle. Thereby, the top surface 5a of the wavelength converting material 5 can be formed in balanced concave shapes while the space 13 is also formed in a balanced shape. Thus, the disclosed subject matter can also provide the semiconductor light-emitting device 1d using the plurality of semiconductor light-emitting chips having a reliable structure, which can emit a wavelength converted light having a higher light-emitting efficiency and a high light-harvesting efficiency.

As described above, the disclosed subject matter can form the space 13 between the bottom surface 6b of the encapsulating resin 6 and the top surface 5a of the wavelength converting material 5 because the top surface 5a can bank from the inner top edge 12aa of the first conductor pattern 12a toward the intersection 14 of the bonding wire 4 and the wavelength converting material 5 using the surface tension generated at the contacting portion of the bonding wire 4 and the wavelength converting material 5 and because the encapsulating resin 6 is pulled toward the top surface 6a while the bottom surface 6b is formed in the substantially concave shape toward the top surface 6a. Accordingly, provided the space 13 is formed in a narrow shape, even if each of the encapsulating resin 6 and the wavelength converting material 5 contacts with respect to each other, the stress of the encapsulating resin 6 caused by the expansion of the wavelength converting resin 5 may be very weak because the stress of the encapsulating resin 6 can be relieved until the top surface 5a of the wavelength converting material 5 gets to a total extent of the bottom surface 6b of the encapsulating resin 6. Therefore, the disclosed subject matter can provide reliable semiconductor light-emitting devices, which can prevent a crack generated between the wavelength converting material 5 and the encapsulating resin 6 because of the extremely different thermal expansion coefficients thereof by forming the space 13.

Moreover, the number of Rays emitted from the semiconductor light-emitting device can be larger than that of Rays emitted from a conventional device, and also the Rays emitted from the semiconductor light-emitting device can tend to be emitted from a direction toward the optical axis (X) of device as compared with the Rays emitted from the conventional device. Accordingly, the disclosed subject matter can provide the semiconductor light-emitting device, which can emit light having a high light-harvesting efficiency and a high light-emitting intensity.

Furthermore, the above-described embodiments can include semiconductor light-emitting devices using a plurality of semiconductor light-emitting chips. Thus, the disclosed subject matter can provide small semiconductor light-emitting devices having a high light-emitting efficiency and a high light-harvesting efficiency in addition to a high reliability such that can be used as a light source for automobile parts such as a position lamp, a room lamp and the like, and also can be used to illuminate goods laid out in a narrow show window, a vending machine and the like, and furthermore can be used to illuminate letters and figures in a thin display for the vending machine, etc.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art and patent document references described above are hereby incorporated in their entirety by reference.

What is claimed is:

1. A semiconductor light-emitting device including an optical axis comprising:

a base board including a first board and a second board having a top surface, and being formed in a substantially rectangular tabular shape, the first board having a top surface and a through hole, including a first conductor pattern having an inner top edge adjacent the through hole, and the first board including at least one first bonding conductor pattern formed on the top surface of the first board, the base board attaching the first board on the top surface of second board, and thereby the through hole of the first board being configured to form a cavity along with a part of the top surface of the second board in the base board, the cavity of the base board being provided with a bottom surface of the cavity by using the part of the top surface of the second board exposed from the first board, and the cavity including a center on the bottom surface of the cavity, and the base board further including at least one second bonding conductor pattern formed on at least one of the top surface of the first board and the top surface of the second hoard, wherein the optical axis of the semiconductor light-emitting device intersects with the center on the bottom surface of the cavity at a substantially right angle;

at least one semiconductor light-emitting chip having a top surface, a bottom surface, a first electrode formed on the top surface and a second electrode, and mounted substantially on the bottom surface of the cavity, the top surface of the semiconductor light-emitting chip including a center on the top surface, and the first electrode of the semiconductor light-mitting chip being electrically connected to the first bonding conductor pattern via a first bonding wire;

a wavelength converting material having a top surface made by mixing at least a phosphor with a first transparent resin having a thermal expansion coefficient, encapsulating the at least one semiconductor light-emitting chip and a part of the first bonding wire in the cavity, and the top surface of the wavelength converting material banking from the inner top edge of the first conductor pattern of the first board toward the first bonding wire; and an encapsulating resin being composed of a second transparent resin having a thermal expansion coefficient, encapsulating another part of the first bonding wire, which is not encapsulated by the wavelength converting material, and covering the wavelength converting material, wherein the encapsulating resin and the wavelength converting material contacts with each other substantially between the part and the other part of the first bonding wire, and therefore the semiconductor light-emitting device is configured to form a space between the encapsulating resin and the top surface of the wavelength converting material at least by using said bank from the inner top edge of the first conductor pattern of the first board toward the first bonding wire.

2. The semiconductor light-emitting device according to claim 1, wherein the at least one second bonding conductor pattern is formed on at least the bottom surface of the cavity, which is provided by using the part of the top surface of the second board exposed from the first board, and the second electrode of the semiconductor light-emitting chip is formed on the bottom surface of the semiconductor light-emitting chip, and therefore is electrically connected to the second bonding conductor pattern.

3. The semiconductor light-emitting device according to claim 1, wherein the first electrode of the semiconductor light-emitting chip is formed substantially at the center of the top surface of the semiconductor light-emitting chip.

4. The semiconductor light-emitting device according to claim 1, wherein the bottom surface of the cavity is formed in a substantially planar shape and also is formed in a substantially circular shape in a top view from the optical axis of the semiconductor light-emitting device.

5. The semiconductor light-emitting device according to claim 1, wherein the thermal expansion coefficient of the first transparent resin included in the wavelength converting material is larger than that of the second transparent resin of the encapsulating resin.

6. The semiconductor light-emitting device according to claim 1, wherein the first transparent resin of the wavelength converting material includes a silicone resin and the second transparent resin of the encapsulating resin includes an epoxy resin.

7. The semiconductor light-emitting device according to claim 1, wherein when the at least one semiconductor light-emitting chip is a plurality of semiconductor light-emitting chips, each of first electrodes of the at least one semiconductor light-emitting chip is located substantially on at least one of the optical axis of the semiconductor light-emitting device and an imaginary circle in which the optical axis of the semiconductor light-emitting device is central to the imaginary circle, and when the at least one semiconductor light-emitting chip is a single semiconductor light-emitting chip, the first electrodes of the at least one semiconductor light-emitting chip is located substantially on the optical axis of the semiconductor light-emitting device.

8. The semiconductor light-emitting device according to claim 2, wherein when the at least one semiconductor light-emitting chip is a plurality of semiconductor light-emitting chips, each of first electrodes of the at least one semiconductor light-emitting chip is located substantially on at least one of the optical axis of the semiconductor light-emitting device and an imaginary circle in which the optical axis of the semiconductor light-emitting device is central to the imaginary circle, and when the at least one semiconductor light-emitting chip is a single semiconductor light-emitting chip, the first electrodes of the at least one semiconductor light-emitting chip is located substantially on the optical axis of the semiconductor light-emitting device.

9. The semiconductor light-emitting device according to claim 1, wherein the top surface of the wavelength converting material is formed in a substantially concave shape in a direction toward the at least one semiconductor light-emitting chip between the inner top edge of the first conductor pattern of the first board and the first bonding wire.

10. The semiconductor light-emitting device according to claim 2, wherein the top surface of the wavelength converting material is formed in a substantially concave shape in a direction toward the at least one semiconductor light-emitting chip between the inner top edge of the first conductor pattern of the first board and the first bonding wire.

11. The semiconductor light-emitting device according to claim 1, wherein the at least one second bonding conductor pattern is formed on the top surface of the first board in the base board, which is located opposite the at least one first bonding conductor pattern, the second electrode of the semiconductor light-emitting chip is formed on the top surface of the semiconductor light-emitting chip along with the first electrode thereof and is electrically connected to the second bonding conductor pattern via a second bonding wire, the wavelength converting material also encapsulates a part of the second bonding wire in the cavity and the top surface of the wavelength converting material also banks from the inner top edge of the first conductor pattern of the first board toward the second bonding wire, and the encapsulating resin also encapsulates another part of the second bonding wire, which is not encapsulated by the wavelength converting material, and covering the wavelength converting material, wherein the encapsulating resin and the wavelength converting material contacts with each other substantially between the part and the other part of the second bonding wire, and therefore the semiconductor light-emitting device is configured to form a space between the encapsulating resin and the top surface of the wavelength converting material at least further by using said bank from the inner top edge of the first conductor pattern of the first board toward the second bonding wire.

12. The semiconductor light-emitting device according to claim 11, further comprising:
   a second conductor pattern is formed on at least the bottom surface of the cavity, which is provided by using the part of the top surface of the second board exposed from the first board, and the second conductor pattern is located between the bottom surface of cavity and the bottom surface of the at least one semiconductor light-emitting chip.

13. The semiconductor light-emitting device according to claim 11, wherein each of the first electrode and the second electrode formed on the top surface of the semiconductor light-emitting chip is located substantially on an imaginary circle, in which the optical axis of the semiconductor light-emitting device is central to the imaginary circle.

14. The semiconductor light-emitting device according to claim 11, wherein the bottom surface of the cavity is formed in a substantially planar shape and also is formed in a substantially circular shape in a top view from the optical axis of the semiconductor light-emitting device.

15. The semiconductor light-emitting device according to claim 11, wherein the thermal expansion coefficient of the first transparent resin included in the wavelength converting material is larger than that of the second transparent resin of the encapsulating resin.

16. The semiconductor light-emitting device according to claim 11, wherein the first transparent resin of the wavelength converting material includes a silicone resin and the second transparent resin of the encapsulating resin includes an epoxy resin.

17. The semiconductor light-emitting device according to claim 11, wherein when the at least one semiconductor light-emitting chip is a plurality of semiconductor light-emitting chips, a respective one of first electrodes and second electrodes of the at least one semiconductor light-emitting chip is located substantially on at least one imaginary circle in which the optical axis of the semiconductor light-emitting device is central to the imaginary circle, and when the at least one semiconductor light-emitting chip is a single semiconductor light-emitting chip, each of the first electrode and the second electrode of the at least one semiconductor light-emitting chip is located substantially on one imaginary circle in which the optical axis of the semiconductor light-emitting device is central to the imaginary circle.

18. The semiconductor light-emitting device according to claim 12, wherein when the at least one semiconductor light-emitting chip is a plurality of semiconductor light-emitting chips, a respective one of first electrodes and second electrodes of the at least one semiconductor light-emitting chip is located substantially on at least one imaginary circle in which the optical axis of the semiconductor light-emitting device is central to the imaginary circle, and when the at least one semiconductor light-emitting chip is a single semiconductor light-emitting chip, each of the first electrode and the second electrode of the at least one semiconductor light-emitting chip is located substantially on one imaginary circle in which the optical axis of the semiconductor light-emitting device is central to the imaginary circle.

19. The semiconductor light-emitting device according to claim 11, wherein the top surface of the wavelength converting material is formed in a substantially concave shape in a direction toward the at least one semiconductor light-emitting chip between the inner top edge of the first conductor pattern of the first board and the second bonding wire.

20. The semiconductor light-emitting device according to claim 12, wherein the top surface of the wavelength converting material is formed in a substantially concave shape in a direction toward the at least one semiconductor light-emitting chip between the inner top edge of the first conductor pattern of the first board and the second bonding wire.

* * * * *